United States Patent
Kang

(10) Patent No.: US 7,697,368 B2
(45) Date of Patent: Apr. 13, 2010

(54) SEMICONDUCTOR MEMORY DEVICE AND METHOD OF INPUTTING ADDRESSES THEREIN

(75) Inventor: Khil-Ohk Kang, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 177 days.

(21) Appl. No.: 11/967,577

(22) Filed: Dec. 31, 2007

(65) Prior Publication Data

US 2009/0003100 A1 Jan. 1, 2009

(30) Foreign Application Priority Data

Jun. 27, 1920 (KR) .................. 10-2007-0063539

(51) Int. Cl.
G11C 11/00 (2006.01)
(52) U.S. Cl. .................. 365/230.08; 365/230.01; 365/201
(58) Field of Classification Search .......... 365/230.08, 365/230.01, 201
See application file for complete search history.

(56) References Cited

U.S. PATENT DOCUMENTS 5,553,025 A 9/1996 Haraguchi 6,842,033 B1 1/2005 Kim et al.
7,450,463 B2 * 11/2008 Lee .................. 365/230.08

FOREIGN PATENT DOCUMENTS

| JP | 01-173499 | 7/1989 |
| JP | 2004-045090 | 2/2004 |
| KR | 1020030051030 A | 6/2003 |
| KR | 1020050062837 A | 6/2005 |

OTHER PUBLICATIONS

Notice of Allowance issued from Korean Intellectual Property Office on Apr. 23, 2009 with an English Translation.
Foreign Office Action issued on Oct. 15, 2008 in the corresponding KR application 10-2007-0063539 with an English translation.

* cited by examiner

*Primary Examiner*—Son Dinh
*Assistant Examiner*—Nam Nguyen
(74) *Attorney, Agent, or Firm*—IP&T Law Firm PLC

(57) ABSTRACT

A semiconductor memory device is capable of reducing a test time by sharing input pins of addresses for the test, thereby reducing test costs also. The semiconductor memory device includes first and second address buffer units. The first address buffer unit is configured to transmit a plurality of normal addresses to an internal circuit and store one or more of the received normal addresses. The second address buffer unit is configured to transmit one or more external bank addresses to the internal circuit as internal bank addresses in a normal mode and transmit addresses stored in the first address buffer unit to the internal circuit as the internal bank addresses in a test mode.

12 Claims, 5 Drawing Sheets

SEMICONDUCTOR MEMORY DEVICE AND METHOD OF INPUTTING ADDRESSES THEREIN

CROSS-REFERENCE TO RELATED APPLICATIONS

The application claims priority to Korean patent application number. 10-2007-0063539, filed on Jun. 27, 2007, which is incorporated by reference in its entirety.

BACKGROUND OF THE INVENTION

The present invention relates to a semiconductor memory device, and more particularly to a technology of reducing a number of address pins used to test it.

As is well known in the art, a semiconductor memory device manufactured by a series of processes operates in response to addresses, power, commands, data, etc. inputted from outside, as defined in JEDEC (Joint Electron Device Engineering Council). Here, the addresses are classified into bank addresses for designating each of banks and normal addresses. The banks are equal-sized parts into which an area where data cells of the semiconductor memory device coexist is divided for efficient operation of data. There are various numbers of banks such as 4 or 8 banks depending on the size of a chip.

FIG. 1 is a block diagram showing the connection of address channels between test equipment and a semiconductor memory device on the existing test.

Addresses are inputted from the test equipment to the semiconductor memory device during test. For convenience of explanation, it is assumed that there are 2 bank addresses and 13 normal addresses.

Meanwhile, a line connected between the test equipment and the semiconductor memory device is called a channel. If the addresses are given as above, the test equipment should assign 15 address channels to each semiconductor memory device. FIG. 1 shows a case where 128 memory devices are tested simultaneously. In this case, the test equipment must have 1920 address channels.

FIG. 2 is a block diagram illustrating the arrangement of address channels to address pads on the existing test.

As shown in the drawing, 15 addresses A1 to A15 are inputted from the test equipment to the memory device as 2 bank addresses BA0 and BA1 and 13 normal addresses NA0 to NA12. Based on the addresses so inputted, the memory device writes/reads data in/from desired addresses.

As is well known in the art, the test is a very important process in manufacturing the semiconductor memory device and test time is directly related to manufacturing costs. The test of the semiconductor memory device is performed by applying various signals thereto through the test equipment. However, the number of channels in the test equipment is limited. Thus, the decrease in the number of channels required for testing is an important issue in the semiconductor memory device.

In other words, the more the number of channels (or pins) required for test is decreased, the greater the number of chips can be tested at a time by the same equipment. This reduces the test time as well as manufacturing costs.

SUMMARY OF THE INVENTION

Embodiments of the invention are directed to providing a semiconductor memory device capable of reducing a test time by sharing input pins of addresses for the test, thereby reducing test costs also.

In one embodiment, a semiconductor memory device includes first address buffer unit configured to transmit a plurality of normal addresses to an internal circuit and store one or more of the received normal addresses, and the second address buffer unit configured to transmit one or more external bank addresses to the internal circuit as internal bank addresses in a normal mode and transmit addresses stored in the first address buffer unit to the internal circuit as the internal bank addresses in a test mode.

In another embodiment, a method of inputting addresses to a semiconductor memory device in a test mode includes receiving and storing some of a plurality of normal addresses in advance before a time when the normal addresses are actually inputted to the semiconductor memory device, and transmitting the stored addresses to an input path of bank addresses as bank addresses.

In a further embodiment, a semiconductor memory device includes first address buffer unit configured to transmit a plurality of addresses from outside of the semiconductor memory device to an input path of addresses and store one or more of the received addresses, and the second address buffer unit configured to transmit one or more addresses from the outside of the semiconductor memory device to the input path in a normal mode and to transmit the one or more addresses separately stored in the first address buffer unit to the input path in a test mode.

In a further embodiment, a semiconductor memory device includes an internal circuit; a plurality of address buffers configured to transmit a plurality of normal addresses to an internal circuit; a storing circuit configured to store one or more of the received normal addresses separately; one or more bank address buffers configured to receive one or more external bank addresses; and a transmitting circuit configured to transmit to the internal circuit bank addresses outputted from the one or more bank address buffers as internal bank addresses in a normal mode and the one or more addresses stored in the storing circuit as the internal bank addresses in a test mode.

That is, a semiconductor memory device in accordance with the invention receives bank addresses ahead of normal addresses via normal address pins. There is no need for bank address pins to receive the bank addresses only.

DESCRIPTION OF SPECIFIC EMBODIMENTS

Hereinafter, preferred embodiments of the invention will be described in detail with reference to the accompanying drawings so that those skilled in the art can readily carry out the invention.

Figure 1:
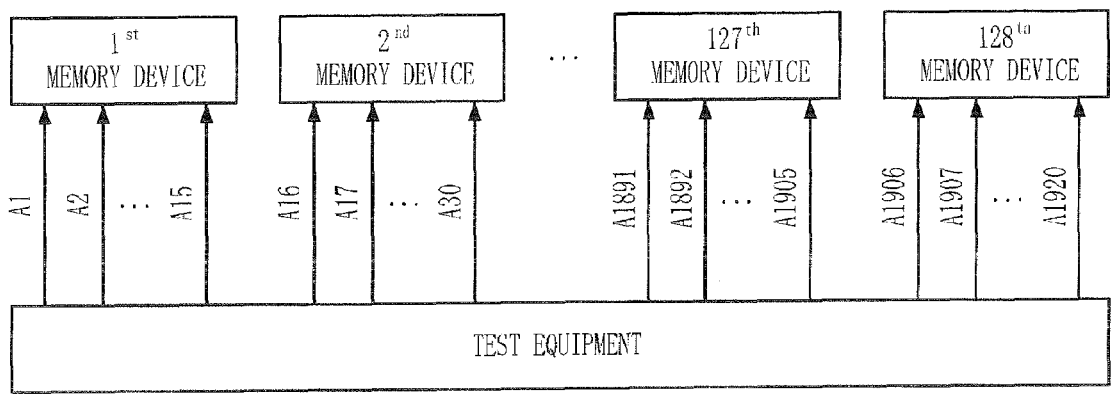
FIG. 1 is a block diagram showing the connection of address channels between test equipment and a semiconductor memory device on the existing test.
Figure 2:
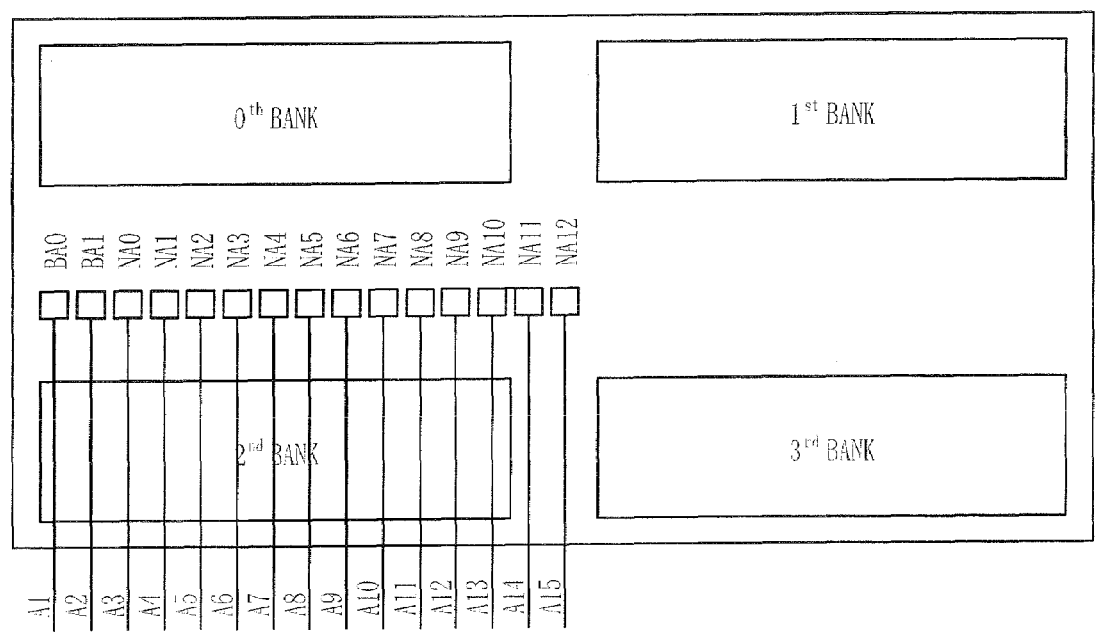
FIG. 2 is a block diagram showing the arrangement of address channels to address pads on the existing test.
Figure 3:
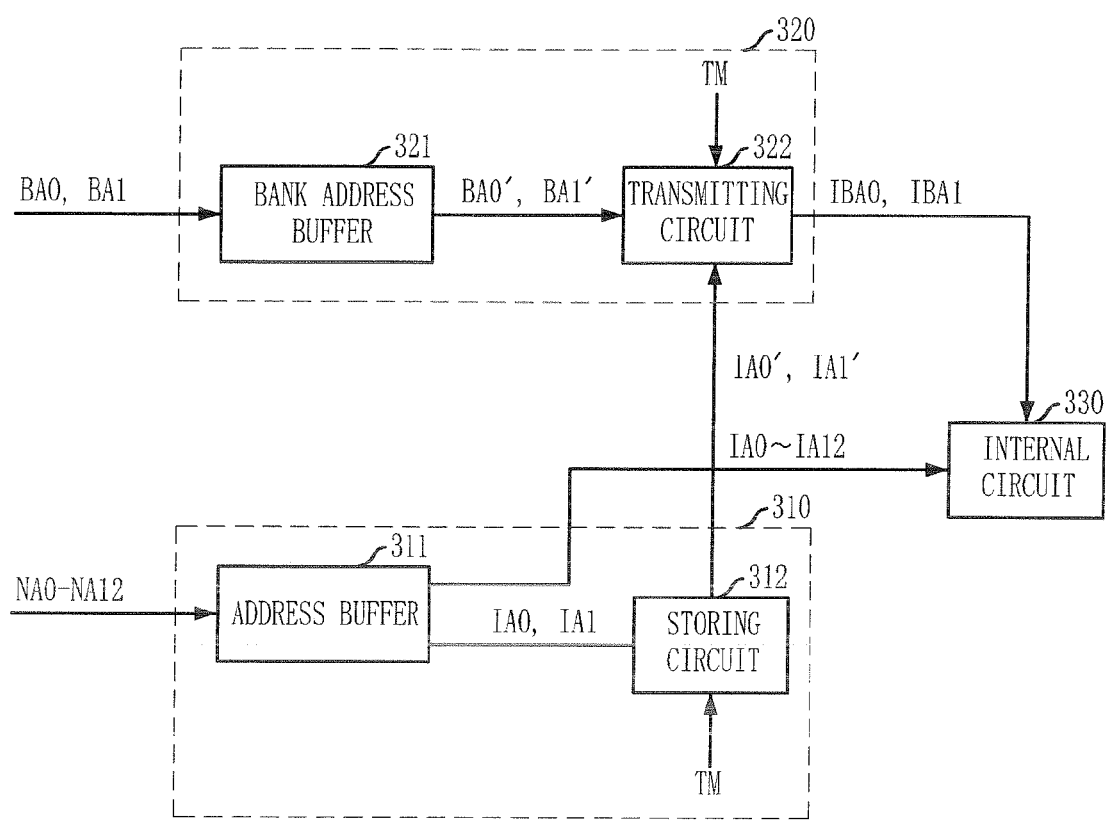
FIG. 3 is a block diagram of a semiconductor memory device in accordance with a preferred embodiment of the invention.

FIG. 3 is a block diagram of a semiconductor memory device in accordance with a preferred embodiment of the invention. The semiconductor memory device of the invention includes a first address buffer unit 310 and a second address buffer unit 320.

The first address buffer unit 310 receives a plurality of normal addresses NA0-NA12 and transmits them to an input path of the normal addresses. The first address buffer unit 310 stores one or more addresses IA0 and IA1 of the received normal addresses separately The second address buffer unit 320 receives one or more bank addresses BA0 and BA1 from the outside of a chip and transmits them to an input path of the bank addresses in a normal mode. However, the second address buffer unit 320 receives no bank addresses from the outside of the chip and transmits the one or more addresses IA0' and IA1' separately stored in the first address buffer unit 310 to an input path of the bank addresses in a test mode. In the drawing, an internal circuit 330 is a circuit provided in the memory device, which accepts the internal addresses and internal bank addresses IA0-IA12 and IBA0 and IBA1 and performs the operations related to them.

More specifically, as illustrated in the drawing, the first address buffer unit 310 is composed of an address buffer 311 and a storing circuit 312. The address buffer 311 includes a plurality of address buffer elements for receiving a plurality of normal addresses NA0-NA12 and transmitting them to an internal circuit 330 as the internal addresses IA0-IA12. The storing circuit 312 stores one or more internal addresses IA0 and IA1 of outputs of the address buffer 311 separately.

That is, the first address buffer unit 310 is provided with the general address buffer 311 for receiving the normal addresses NA0-NA12, and the storing circuit 312 for storing some addresses IA0 and IA1 of the addresses to be used as the internal bank addresses IBA0 and IBA1.

The storing circuit 312 operates in response to a test mode signal TM enabled in the test mode. When the test mode signal TM is disabled, the storing circuit 312 outputs the stored addresses IA0' and IA1' in a logic low. When the test mode signal TM is enabled, the storing circuit 312 outputs the stored addresses IA0' and IA1' in logic levels opposite to the logic levels of the internal addresses IA0 and IA1. As will be described later, the stored addresses IA0' and IA1' having logic levels opposite to the internal addresses IA0 and IA1 are inverted by a transmitting circuit 322 of the second address buffer unit 320 in the test mode and used as the internal bank addresses IBA0 and IBA1. As a result, the addresses stored in the storing circuit are used as the bank addresses in the test mode.

The second address buffer unit 320 is composed of a bank address buffer 321 and a transmitting circuit 322. The bank address buffer 321 includes one or more bank address buffer elements for receiving one or more bank addresses BA0 and BA1 in the normal mode. The transmitting circuit 322 transmits addresses BA0' and BA1' outputted from the bank address buffers 321 to the internal circuit 330 as the internal bank addresses IBA0 and IBA1 in the normal mode and the stored addresses IA0' and IA1' from the storing circuit 312 to the internal circuit 330 as the internal bank addresses IBA0 and IBA1 in the test mode.

Each of the one or more bank address buffer elements is the same as the general address buffer and is an address buffer which receives only the bank addresses BA0 and BA1. The transmitting circuit 322 transmits the bank addresses BA0 and BA1, which are received through the bank address buffers 321, as the internal bank addresses IBA0 and IBA1 to be used in the internal circuit 330 in the normal mode. However, the transmitting circuit 322 transmits the stored addresses IA0' and IA1' stored in the storing circuit 312 to the internal circuit 330 as the internal bank addresses IBA0 and IBA1 in the test mode. To be more specific, the transmitting circuit 322 inverts the stored addresses IA0' and IA1 received in the test mode and transmits them to the internal circuit 330 as the internal bank addresses IBA0 and IBA1. As mentioned above, the stored addresses IA0' and IA1' are just inverted addresses of the internal addresses IA0 and IA1, and thus, the internal address IA0 and IA1 become the internal bank address IBA0 and IBA1 in the test mode.

The whole operation of the semiconductor memory device in accordance with the invention will be set forth below for each of the normal mode and test mode.

First, in operation of the normal mode, the normal addresses NA0-NA12 inputted to the address buffers 311 are transmitted to the internal circuit 330 as the internal addresses IA0 and IA12, and the bank addresses BA0 and BA1 inputted to the bank address buffers 321 are applied to the internal circuit 330 as the internal bank addresses IBA0 and IBA1. That is, the semiconductor memory device operates by using all address pins in the normal mode.

In operation of the test mode, the test equipment inputs normal addresses NA0 and NA1 before the timing when they will be normally inputted. Then, the addresses NA0 and NA1 are stored in the storing circuit 312. Upon execution of the real test, the stored addresses IA0' and IA1' are inputted to the internal circuit 330 through the transmitting circuit 322 as the internal bank addresses IBA0 and IBA1, thereby performing the operation of the memory device. In summary, the memory device of the invention receives and stores the normal addresses NA0 and NA1 in advance in the test mode and uses these as the internal bank addresses IBA0 and IBA1 for test.

The invention has to input the bank addresses BA0 and BA1 in the form of the normal addresses NA0 and NA1 once more in advance during test. However, it requires a little additional time, because the test is actually performed by increasing/decreasing the normal addresses with the bank addresses being fixed even in the conventional memory device. And, during the test, the invention doesn't need to assign separate channels (or pins) for receiving the bank addresses and thus can decrease the number of address channels (or pins) used in the memory device.

Figure 4:
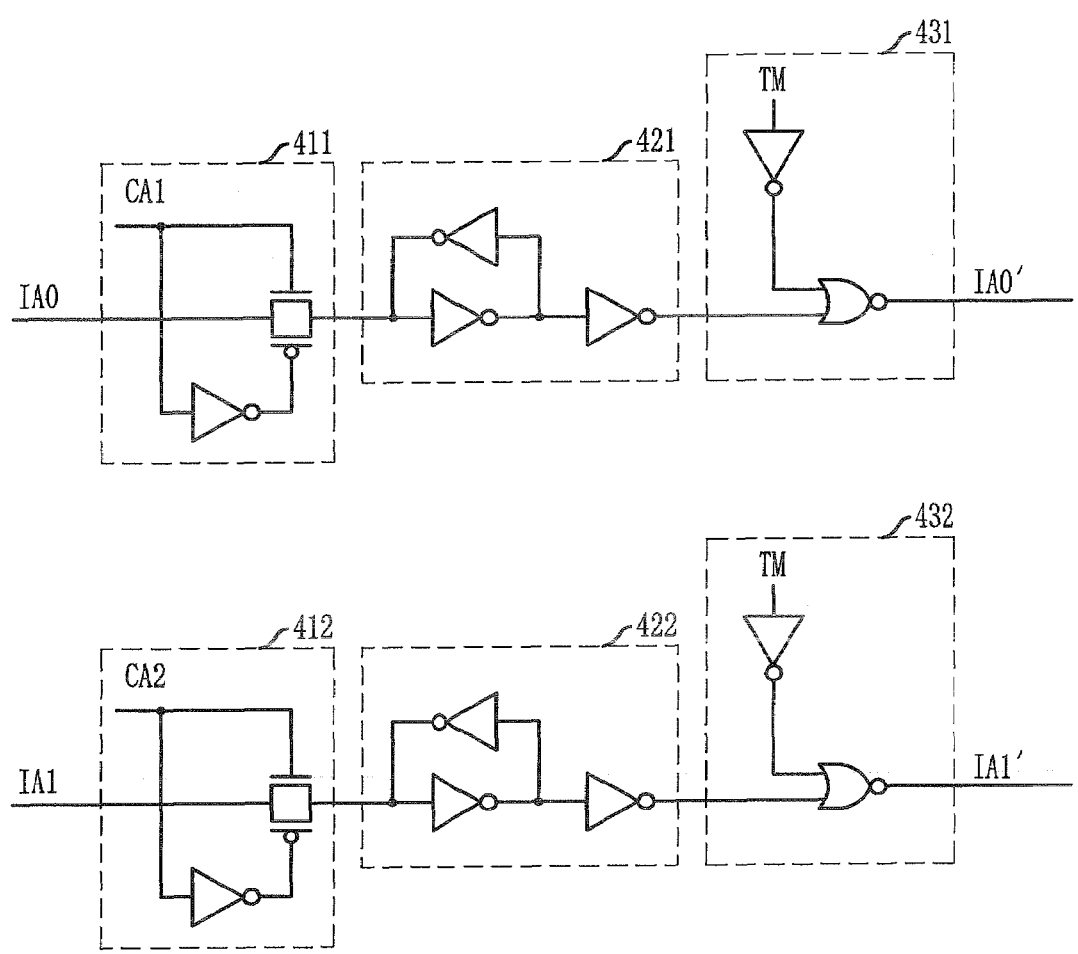
FIG. 4 illustrates a schematic circuit diagram of a storing circuit shown in FIG. 3.

FIG. 4 illustrates a schematic circuit diagram of the storing circuit 312 shown in FIG. 3.

As mentioned above, the storing circuit 312 serves to store one or more addresses of the plurality of internal addresses separately to be used as internal bank addresses. The storing circuit 312 is composed of latches 421 and 422 for storing the internal addresses IA0 and IA1, respectively, and drivers 431 and 432 for outputting logic low signals (always outputting the addresses IA0' and IA1' as logic low) in the normal mode, and outputting the addresses IA0' and IA1' with logic levels opposite to logic levels stored in the lathes 421 and 422 in the test mode, as shown in the drawing. Further, pass gates 411 and 412 may be further provided at the input end to control the timing when the internal addresses IA0 and IA1 to be used as the internal bank address IBA0 and IBA1 are received in advance. Control signals CA1 and CA2 to control the pass gates 411 and 412 are enabled at the timing when the internal addresses IA0 and IA1 to be used as the internal bank address IBA0 and IBA1 are received in advance before the test operation.

In operation, when the test equipment inputs bank addresses in advance in the form of normal addresses NA0 and NA1, the pass gates 411 and 412 are open and the addresses IA0 and IA1 are stored in the latches 421 and 422, respectively. In the normal mode, the test mode signal TM is disabled, so that the outputs IA0' and IA1' of the drivers 431 and 432 are always logic low. However, in the test mode, the test mode signal TM is enabled, so that the outputs IA0' and IA1' of the drivers 431 and 432 become logic levels opposite to the addresses IA0 and IA1 stored in the latches 421 and 422.

Figure 5:
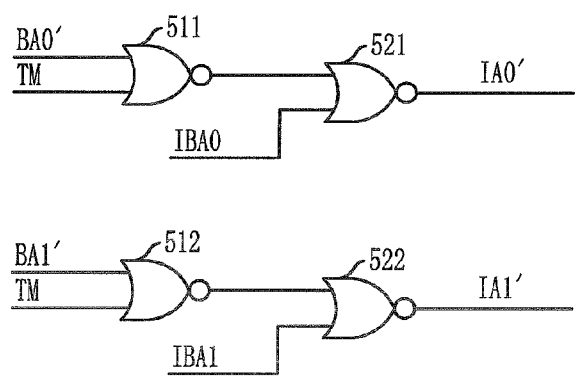
FIG. 5 illustrates a schematic circuit diagram of the transmitting circuit depicted in FIG. 3.

FIG. 5 illustrates a schematic circuit diagram of the transmitting circuit 322 shown in FIG. 3.

As described above, the transmitting circuit makes the addresses BA0' and BA1' equivalent to the internal bank address IBA0 and IBA1 in the normal mode, while making the addresses IA0' and IA1' equivalent to the internal bank address IBA0 and IBA1 in the test mode (see FIG. 3).

This transmitting circuit, as shown in the drawing, is provided with first NOR gates 511 and 512 for performing a logic operation on one of the addresses BA0' and BA1' outputted from the bank address buffers 321 and the test mode signal TM enabled in the test mode, and second NOR gates 521 and 522 for performing a logic operation one of outputs of the first NOR gates 511 and 512 and one of the addresses IA0' and IA1' outputted from the transmitting circuit 312 to provide resulting signals as the internal bank addresses IBA0 and IBA1.

In operation, in the normal mode, the test mode signal TM is logic low and the addresses IA0' and IA1' are also logic low, so that the addresses BA0' and BA1' become the internal bank addresses IBA0 and IBA1. That is, the bank addresses BA0 and BA1 inputted to the bank address buffers 321 become the internal bank addresses IBA0 and IBA1 used in the inside as they are.

In the test mode, since the test mode signal TM is logic high, the outputs of the first NOR gates become logic low regardless of the addresses BA0' and BA1', and thus, the outputs of the second NOR gates become logic levels opposite to the addresses IA0' and IA1'. In other words, as the addresses IA0' and IA1' have logic levels opposite to the normal addresses NA0 and NA1, the normal addresses NA0 and NA1 become the internal bank addresses IBA0 and IBA1 after all.

Figure 6:
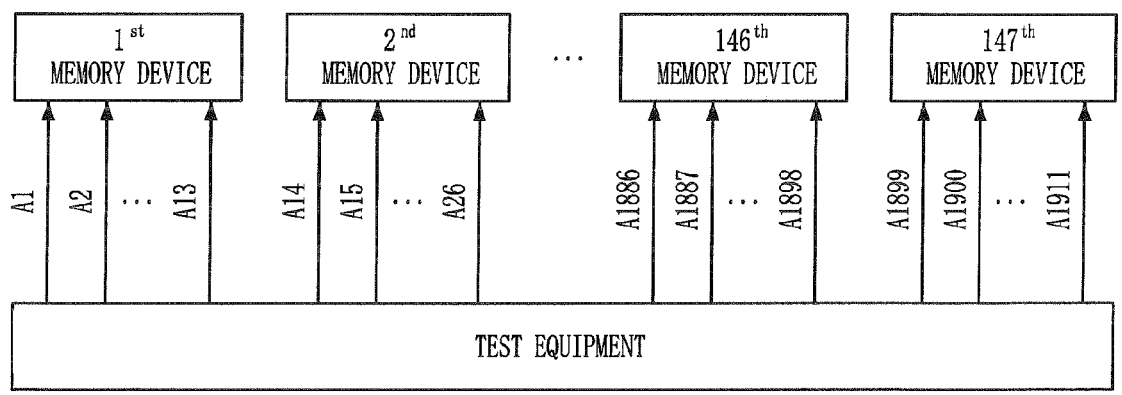
FIG. 6 is a block diagram showing the connection with test equipment when testing the semiconductor memory device in accordance with the invention.

FIG. 6 is a block diagram showing the connection with test equipment when testing the semiconductor memory device in accordance with the invention.

As shown in the drawing, since the semiconductor memory device of the invention doesn't need to separately assign address channels only for receiving bank addresses during test, the number of address channels required per one memory device is reduced from 15 in the prior art to 13. Thus, as depicted in the drawing, only 1911 address channels need to be assigned in the test equipment upon test of 147 memory devices, which leads to a considerable difference from the prior art that 1920 address channels are assigned in order to test 128 memory devices.

Figure 7:
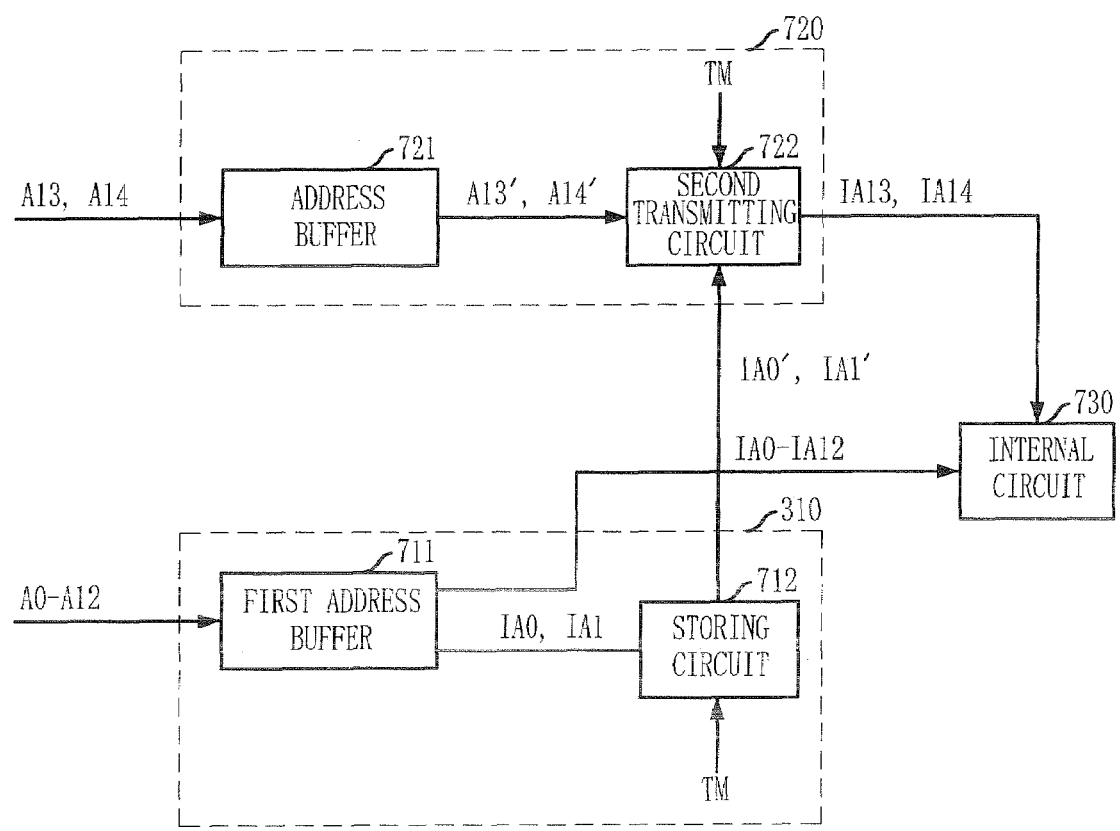
FIG. 7 is a block diagram illustrating a semiconductor memory device in accordance with another preferred embodiment of the invention.

FIG. 7 is a block diagram illustrating the configuration of a semiconductor memory device in accordance with another preferred embodiment of the invention.

As described above, FIG. 3 showed an embodiment in which the second address buffer unit 320 receives and transmits the bank addresses BA0 and BA1 as the internal bank addresses IBA0 and IBA1 in normal operation, and transmits the internal addresses IA0 and IA1 stored in the first address buffer unit 310 as the internal bank addresses IBA0 and IBA1 in test operation. That is, FIG. 3 illustrated an embodiment wherein the memory device doesn't receive the bank addresses and employs the previously stored normal addresses instead of them during the test. However, there is no reason that the addresses received by the second address buffer unit 320 during normal operation may be necessarily bank addresses, but they may be any addresses. FIG. 7 illustrates an embodiment for implementing the above concept.

As shown in FIG. 7, the semiconductor memory device in accordance with another embodiment of the invention includes a first address buffer unit 710 and a second address buffer unit 720. The first address buffer unit 710 receives a plurality of addresses A0-A12 and transmits them to an input path of the addresses (i.e., the internal circuit). The first address buffer unit 710 stores one or more addresses of the addresses A1-A12 separately. The second address buffer unit 720 receives one or more addresses from the outside of a chip and transmits them to an input path of the addresses as internal addresses IA13 and IA14 in the normal mode. The second address buffer unit 720 receives no address from the outside of the chip and transmits the one or more addresses separately stored in the first address buffer unit 710 to an input path of the addresses as internal addresses IA13 and IA14 in the test mode. In addition, the semiconductor memory device further includes an internal circuit 730 therein, which receives addresses and processes the operations associated with the addresses.

The addresses A0-A14 shown in FIG. 7 represent addresses used in the memory device without any classification into normal addresses and bank addresses. In other words, among these, addresses A2 and A3 may be bank addresses or addresses A6 and A7 may be also bank addresses.

The first address buffer unit 710 is provided with a first address buffer 711 and a storing circuit 712. The first address buffer 711 includes a plurality of address buffer elements for receiving a plurality of addresses A0-A12 and transmitting them to the internal circuit 730. The storing circuit 712 stores one or more addresses of the plurality of transmitted addresses IA0-IA12 separately.

Further, the second address buffer unit 720 is provided with a second address buffer 721 and a transmitting circuit 722. The second address buffer 721 includes one or more address buffer elements for receiving one or more addresses in the normal mode. The transmitting circuit 722 receives the addresses A13' and A14' outputted from the second address buffer 721 and transmits them to the internal circuit 730 as the internal address IA13 and IA14 in the normal mode. The transmitting circuit 722 transmits the addresses IA0' and IA1' stored in the storing circuit 712 to the internal circuit as internal addresses IA13 and IA14 in the test mode.

The principle of the embodiment of FIG. 7 is identical to that of the embodiment of FIG. 3 except that the addresses replaced upon test may not necessarily be bank addresses. Therefore, the storing circuit 712 and the transmitting circuit 722 depicted in FIG. 7 may be configured in the same manner as in FIGS. 4 and 5. It will be obvious to those skilled in the art that the storing circuit 712 and the transmitting circuit 722 of FIG. 7 may be designed by considering the corresponding parts shown in FIGS. 4 and 5 and the description therefor. Thus, a detailed description thereof will be omitted here.

In accordance with the semiconductor memory device of the invention set forth above, address channels for receiving bank addresses upon test don't need to be assigned separately. Namely, it is possible to test the semiconductor memory device by using a smaller number of address pins as compared to the prior art.

Thus, the number of memory devices that can be tested at a time by the same test equipment can be increased, thereby leading to the reduction of test time and costs incurred by test.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a first address buffer unit configured to transmit a plurality of normal addresses to an internal circuit and store one or more of the received normal addresses; and
   a second address buffer unit configured to transmit one or more external bank addresses to the internal circuit as internal bank addresses in a normal mode and transmit addresses stored in the first address buffer unit to the internal circuit as the internal bank addresses in a test mode.

2. The semiconductor memory device of claim 1, wherein the first address buffer unit includes:
   a plurality of address buffers configured to transmit the normal addresses to the internal circuit; and
   a storing circuit configured to store the one or more received normal addresses separately.

3. The semiconductor memory device of claim 2, wherein the second address buffer unit includes:
   one or more bank address buffers configured to receive the one or more external bank addresses in the normal mode; and
   a transmitting circuit configured to transmit to the internal circuit bank addresses outputted from the one or more bank address buffers as the internal bank addresses in the normal mode and the one or more addresses stored in the storing circuit as the internal bank addresses in the test mode.

4. The semiconductor memory device of claim 3, wherein the storing circuit includes:
   one or more latches for respectively storing the one or more received normal addresses; and
   drivers configured to output logic low signals in the normal mode and signals with logic levels opposite to the one or more received normal addresses in the test mode.

5. The semiconductor memory device of claim 4, wherein the transmitting circuit includes:
   a first NOR gates configured to perform a logic operation on one of the bank addresses outputted from the one or more bank address buffers and a test mode signal enabled in the test mode; and
   a second NOR gates configured to perform a logic operation on outputs of the first NOR gates and signals from the drivers, respectively, to provide combined signals as the internal bank addresses.

6. A method of inputting addresses to a semiconductor memory device in a test mode, comprising:
   receiving and storing some of a plurality of normal addresses in advance before a time when the normal addresses are actually inputted to the semiconductor memory device; and
   transmitting the stored addresses to an input path of bank addresses as bank addresses.

7. A semiconductor memory device, comprising:
   a first address buffer unit configured to transmit a plurality of addresses from outside of the semiconductor memory device to an input path of addresses and store one or more of the received addresses; and
   a second address buffer unit configured to transmit one or more addresses from the outside of the semiconductor memory device to the input path in a normal mode and to transmit the one or more addresses separately stored in the first address buffer unit to the input path in a test mode.

8. The semiconductor memory device of claim 7, wherein the first address buffer unit includes:
   a plurality of address buffers configured to transmit the plurality of addresses to the input path; and
   a storing circuit configured to store the one or more of the received addresses separately.

9. The semiconductor memory device of claim 8, wherein the second address buffer unit includes:
   one or more address buffers configured to receive the one or more addresses from the outside of the semiconductor memory device in the normal mode; and
   a transmitting circuit configured to transmit to the input path addresses outputted from the one or more address buffers in the normal mode and addresses stored in the storing circuit in the test mode.

10. A semiconductor memory device comprising:
    an internal circuit;
    a plurality of address buffers configured to transmit a plurality of normal addresses to an internal circuit;
    a storing circuit configured to store one or more of the received normal addresses separately;
    one or more bank address buffers configured to receive one or more external bank addresses; and
    a transmitting circuit configured to transmit to the internal circuit bank addresses outputted from the one or more bank address buffers as internal bank addresses in a normal mode and the one or more addresses stored in the storing circuit as the internal bank addresses in a test mode.

11. The semiconductor memory device of claim 10, wherein the storing circuit includes:
    one or more latches for respectively storing the one or more received normal addresses; and
    drivers configured to output logic low signals in the normal mode and signals with logic levels opposite to the one or more received normal addresses in the test mode.

12. The semiconductor memory device of claim 11, wherein the transmitting circuit includes:
    a first NOR gates configured to perform a logic operation on one of the bank addresses outputted from the one or more bank address buffers and a test mode signal enabled in the test mode; and
    a second NOR gates configured to perform a logic operation on outputs of the first NOR gates and signals from the drivers, respectively, to provide combined signals as the internal bank addresses.

* * * * *

UNITED STATES PATENT AND TRADEMARK OFFICE
CERTIFICATE OF CORRECTION

PATENT NO. : 7,697,368 B2  Page 1 of 1
APPLICATION NO. : 11/967577
DATED : April 13, 2010
INVENTOR(S) : Khil-Ohk Kang It is certified that error appears in the above-identified patent and that said Letters Patent is hereby corrected as shown below:

On the title page, item [30] Foreign Application Priority Data should read:
June 27, 2007 [KR]   Rep. of Korea ...................... 10-2007-0063539

Signed and Sealed this

Twenty-ninth Day of June, 2010

David J. Kappos
*Director of the United States Patent and Trademark Office*